(12) United States Patent
Zhang et al.

(10) Patent No.: US 10,826,504 B2
(45) Date of Patent: Nov. 3, 2020

(54) TIME-TO-DIGITAL CONVERTER AND PHASE DIFFERENCE DETECTION METHOD

(71) Applicant: MONTAGE TECHNOLOGY CO., LTD., Shanghai (CN)

(72) Inventors: Pengzhan Zhang, Shanghai (CN); Yong Wang, Shanghai (CN); Yanhong Li, Shanghai (CN); Yaomin Wu, Shanghai (CN); Zhongyuan Chang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/807,803

(22) Filed: Mar. 3, 2020

(65) Prior Publication Data
US 2020/0304128 A1     Sep. 24, 2020

(30) Foreign Application Priority Data
Mar. 21, 2019 (CN) .......................... 2019 1 0219184

(51) Int. Cl.
*H03L 7/093*   (2006.01)
*G04F 10/00*   (2006.01)
*H03L 7/099*   (2006.01)

(52) U.S. Cl.
CPC ............ *H03L 7/093* (2013.01); *G04F 10/005* (2013.01); *H03L 7/0995* (2013.01)

(58) Field of Classification Search
CPC ...... H03L 7/093; H03L 7/0995; G04F 10/005
USPC ................ 341/122–166; 327/2, 12, 156, 158
See application file for complete search history.

(56) References Cited

U.S. PATENT DOCUMENTS

| | | | |
|---|---|---|---|
| 6,515,526 B2 * | 2/2003 | Dairi | H03C 3/0925 327/147 |
| 8,929,498 B2 * | 1/2015 | Hoang | H03L 7/183 375/355 |
| 10,637,488 B1 * | 4/2020 | Im | G06F 1/10 |
| 2003/0001557 A1 * | 1/2003 | Pisipaty | H04L 7/033 324/76.53 |
| 2011/0248753 A1 * | 10/2011 | Leistner | H03L 7/085 327/156 |
| 2014/0037033 A1 * | 2/2014 | Hoang | H04L 7/033 375/355 |
| 2020/0186153 A1 * | 6/2020 | Wada | H03L 7/099 |

* cited by examiner

*Primary Examiner* — Lam T Mai
(74) *Attorney, Agent, or Firm* — Oliff PLC

(57) ABSTRACT

A time-to-digital converter and a phase difference detection method are disclosed. The time-to-digital converter includes a detection unit and a digital control circuit. The detection unit comprising: a phase detection circuit, a first and a second clock signal are respectively coupled to an identical input terminal of the phase detection circuit and a reference signal is coupled to another input terminal of the phase detection circuit; the phase detection circuit is configured to output a pulse width corresponding to a phase difference between the first or the second clock signal and the reference signal; a filter circuit, coupled to an output terminal of the phase detection circuit; a ring oscillator circuit, coupled to an output terminal of the filter circuit and configured to output an oscillation clock signal corresponding to the pulse width. The digital control circuit is configured to provide the reference signal and receive the oscillation clock signal.

11 Claims, 8 Drawing Sheets

TIME-TO-DIGITAL CONVERTER AND PHASE DIFFERENCE DETECTION METHOD

TECHNICAL FIELD

This disclosure generally relates to an integrated circuit, particularly to a time-to-digital converter and a phase difference detection method.

BACKGROUND OF THE INVENTION

Conventional structure of time-to-digital converter is as shown in FIG. 1. The time-to-digital converter comprises a set of delay units 2 connected in series and a set of D triggers 1, each delay unit 2 cooperates with one trigger 1. A start signal and a stop signal are input signals to be detected. The start signal passes through sequentially the set of the delay units and a set of delayed start signals D<N:0> are respectively output by the set of the delay units. The trigger may record a time difference between the stop signal and the corresponding delayed start signal. Working process of the time-to-digital converter is shown as FIG. 2, the stop signal is used as a sampling clock signal, each delayed start signal is sampled by rising edge of the stop signal, and signals Q<N:0> are respectively output through the D triggers 1. According to the value of signals Q<N:0>, the time difference (skew) between the rising edge of the start signal with the rising edge of the stop signal can be obtained.

The conventional scheme described above has low detection accuracy of time difference and is not suitable for high-precision time difference detection due to the limitations of sampling accuracy and output metastable interval of the D trigger. Meanwhile, the required power consumption and chip area of the conventional scheme are significantly increased with the improvement of detection range and precision, which is not suitable for low-cost and low-power applications.

SUMMARY OF THE INVENTION

The purpose of the application is to provide a time-to-digital converter and a phase difference detection method for a clock signal, which can improve detection accuracy of time difference of the time-to-digital converter and save chip area and power consumption.

The application discloses a time-to-digital converter, comprising a detection unit and a digital control circuit:

the detection unit comprising:

a phase detection circuit, wherein a first clock signal and a second clock signal to be detected are respectively coupled to an identical input terminal of the phase detection circuit and a reference signal is coupled to another input terminal of the phase detection circuit; the phase detection circuit is configured to output a pulse width corresponding to a phase difference between the first clock signal or the second clock signal and the reference signal;

a filter circuit, coupled to an output terminal of the phase detection circuit; and a ring oscillator circuit, coupled to an output terminal of the filter circuit and configured to output an oscillation clock signal corresponding to the pulse width;

the digital control circuit is configured to provide the reference signal and receive the oscillation clock signal.

In a preferred embodiment, wherein delay time of the reference signal is adjustable.

In a preferred embodiment, wherein the delay time of the reference signal is adjusted by a delay unit of the digital control circuit.

In a preferred embodiment, wherein the phase detection circuit employs a D trigger.

In a preferred embodiment, wherein the first clock signal and the second clock signal are separately coupled to the identical input terminal of the phase detection circuit via respective switches.

In a preferred embodiment, wherein the filter circuit comprises an inverter, a PMOS transistor and a capacitor; an input terminal of the inverter is coupled to the output terminal of the phase detection circuit, an output terminal of the inverter is coupled to a gate of the PMOS transistor, a source of the PMOS transistor is coupled to a power supply, a terminal of the capacitor is coupled to a drain of the PMOS transistor, the other terminal of the capacitor is grounded, the drain of the PMOS transistor is coupled to an input terminal of the ring oscillator circuit.

In a preferred embodiment, wherein the filter circuit comprises a resistor and a capacitor; a terminal of the resistor is coupled to the output terminal of the phase detection circuit, the other terminal of the resistor is coupled to a terminal of the capacitor and the ring oscillator circuit, the other terminal of the capacitor is grounded.

In a preferred embodiment, wherein the ring oscillator circuit comprises a plurality of inverters connected in series.

In a preferred embodiment, wherein the time-to-digital converter further comprises a plurality of detection units, the digital control circuit adjusts the reference signal coupled to the plurality of detection units.

The application provides a phase difference detection method, comprising:

inputting, a first clock signal and a reference signal into a phase detection circuit, and outputting, a first oscillation clock signal corresponding to a phase difference between the first clock signal and the reference signal by sequentially passing through a filter circuit and a ring oscillation circuit; and inputting, a second clock signal and the reference signal into the phase detection circuit, and outputting, a second oscillation clock signal corresponding to a phase difference between the second clock signal and the reference signal by sequentially passing through the filter circuit and the ring oscillation circuit;

wherein the phase difference between the first oscillation clock signal and the second oscillation clock signal is equivalent to the phase difference between the first clock signal and the second clock signal.

In a preferred embodiment, the phase difference detection method further comprising:

by adjusting delay time of the reference signal, obtaining, respectively a relationship between a frequency of the first oscillation clock signal and the delay time of the reference signal and a relationship between a frequency of the oscillation second clock signal;

wherein the phase difference between the first clock signal and the second clock signal is equivalent to delay time difference between the corresponding reference signals when the frequencies of the first and second oscillation clock signals are equal.

As described above, the phase difference detection accuracy of the time-to-digital converter of the present application is determined by adjustment precision of the reference signal delay unit, which could realize high-precision phase difference detection between internal signals of a chip and avoid detection error caused by sampling metastable interval of the traditional D trigger structure. And digital conversion accuracy of the phase difference is determined by the number of digits of digital counter of the digital control circuit, which can be easily expanded.

Moreover, the time-to-digital converter of the present application includes a plurality of detection units with a distributed structure and can use only one digital control circuit for adjusting the delay time of the reference signals together for all detection units to save chip area and power consumption.

BRIEF DESCRIPTION OF THE DRAWINGS

Embodiments of the present application are described with reference to the following figures. The figures used in the application are intended to describe embodiments and are not intended to be limiting, and the true scope of the present application is indicated by the claims.

DETAILED DESCRIPTION OF THE ILLUSTRATED EMBODIMENTS

Figure 1:
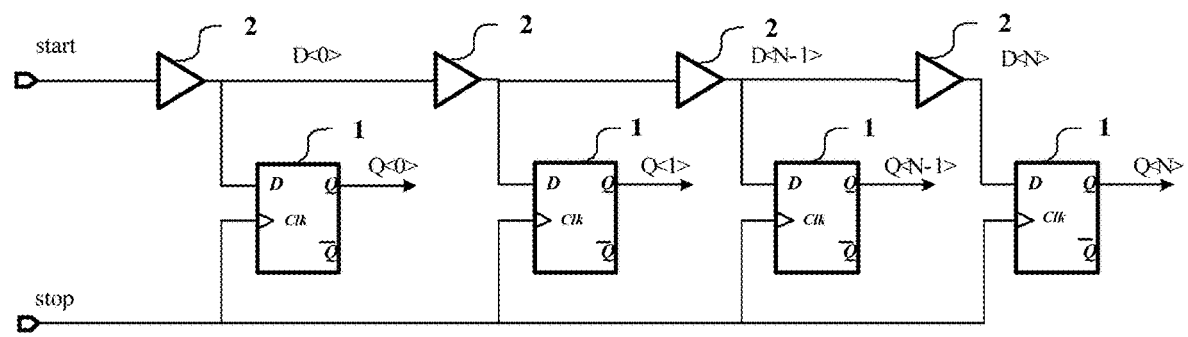
FIG. 1 is a schematic diagram of a phase detection circuit in the prior art.
Figure 2:
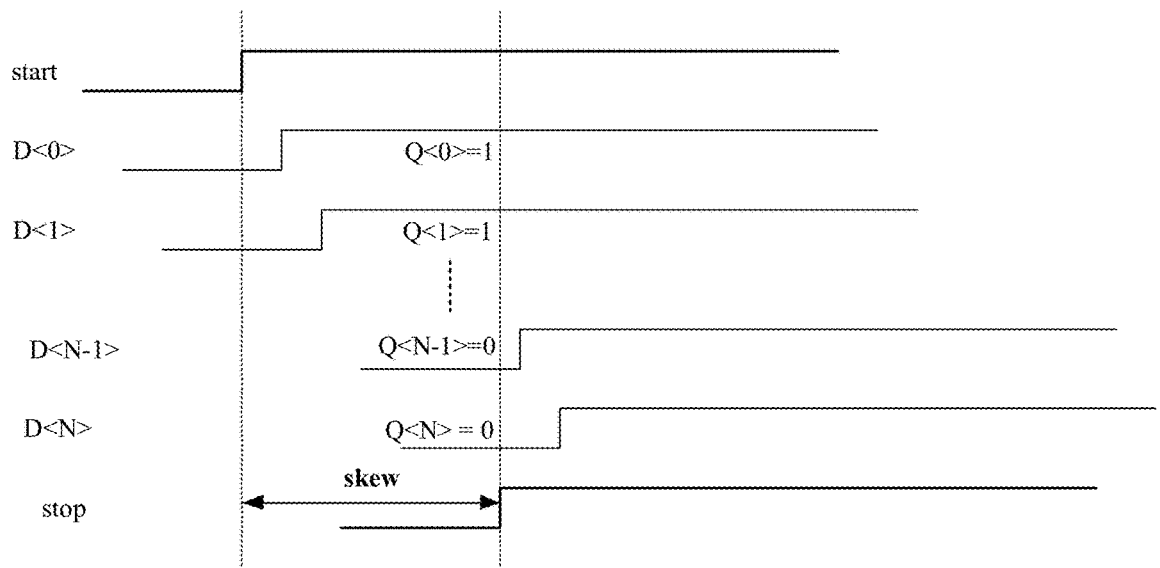
FIG. 2 is a schematic timing diagram of a phase detection circuit in the prior art.
Figure 3A:
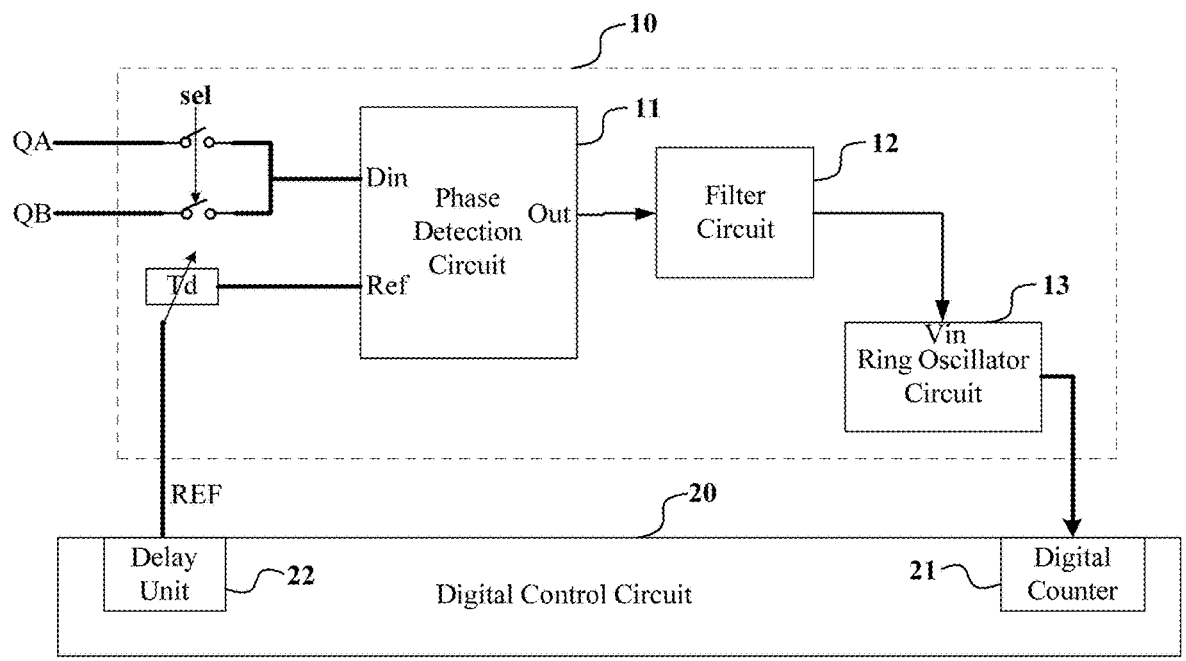
FIG. 3a is a schematic block diagram of a time-to-digital converter according to an embodiment of the present application.

The present application discloses a time-to-digital converter, as shown in FIG. 3a, comprising a detection unit 10 and a digital control circuit 20, wherein the detection unit 10 includes a phase detection circuit 11, a filter circuit 12 and a ring oscillator circuit 13.

Figure 4:
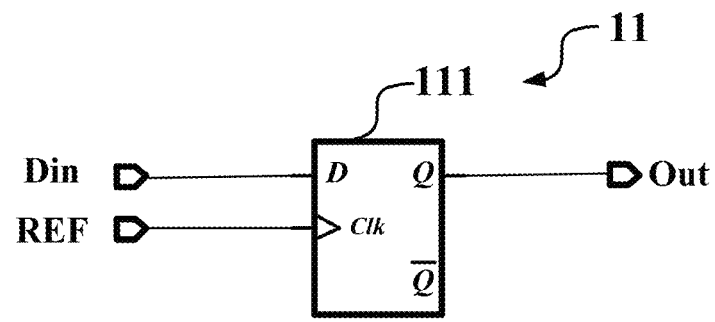
FIG. 4 is a schematic diagram of a phase detection circuit according to an embodiment of the present application.

A first clock signal QA and a second clock signal QB to be detected are respectively coupled to an identical input terminal Din of the phase detection circuit 11. Specifically, the first clock signal QA and the second clock signal QB are separately coupled to the terminal Din of the phase detection circuit 11 via respective switches. One of the first clock signal QA and the second clock signal QB is input to the input terminal Din of the phase detection circuit 11 according to a control signal sel (for example, the first clock signal QA is input to the input terminal Din of the phase detection circuit 11 when the control signal sel is at a low level, the second clock signal QB is input to the input terminal Din of the phase detection circuit 11 when the control signal sel is at a high level). A reference signal REF is coupled to another input terminal Ref of the phase detection circuit, an output terminal Out of the phase detection circuit 11 outputs a pulse width corresponding to a phase difference between the clock signal to be detected and the reference signal, that is, the pulse width corresponding to the phase difference between the first clock signal QA or the second clock signal QB with the reference signal REF is output to the filter circuit 12. Referring to FIG. 4, in a preferred embodiment, the phase detection circuit 11 may be realized by a D trigger 111.

Figure 5A:
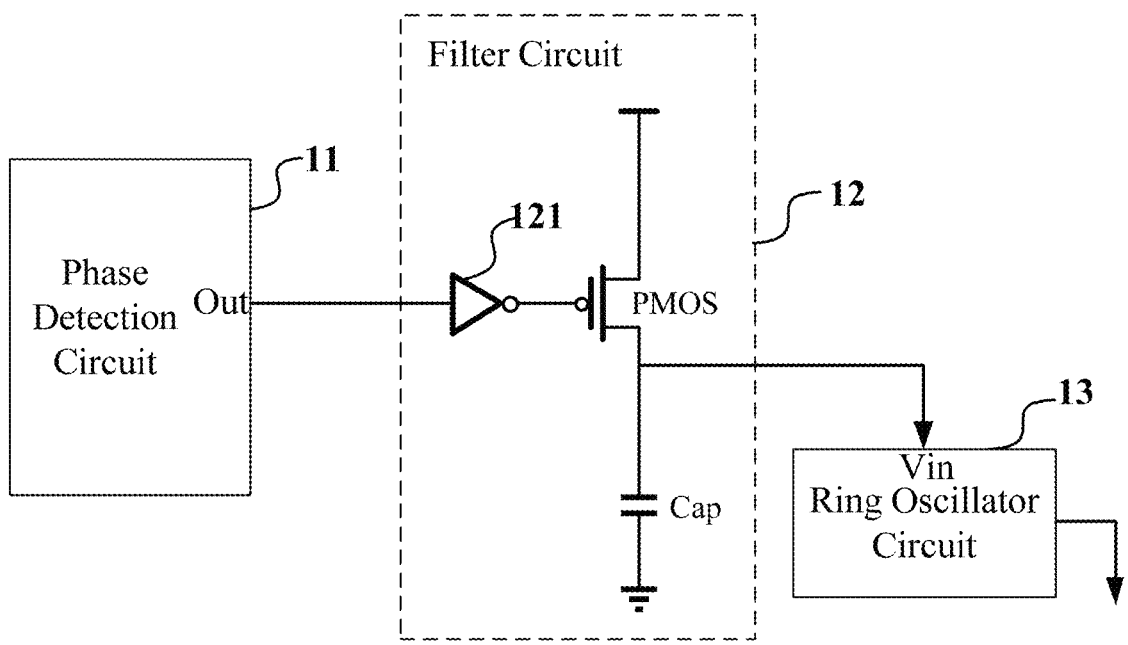
FIG. 5a is a schematic diagram of a filter circuit according to an embodiment of the present application.

The filter circuit 12 of the present application is a low pass filter circuit that extracts DC (Direct Current) portion of the pulse width corresponding to the phase difference between the clock signal to be detected and the reference signal. Referring to FIG. 5a, an input terminal of the filter circuit 12 is coupled to the output terminal Out of the phase detection circuit 11, wherein the filter circuit 12 includes an inverter 121, a PMOS transistor and a capacitor Cap, wherein an input terminal of the inverter 121 is coupled to the output terminal Out of the phase detection circuit 11, an output terminal of the inverter 121 is coupled to a gate of the PMOS transistor, a source of the PMOS transistor is coupled to a power supply, and a terminal of the capacitor Cap is coupled to a drain of the PMOS transistor, the other terminal of the capacitor Cap is grounded, and the drain of the PMOS transistor is coupled to an input terminal Vin of the ring oscillation circuit 13.

Figure 5B:
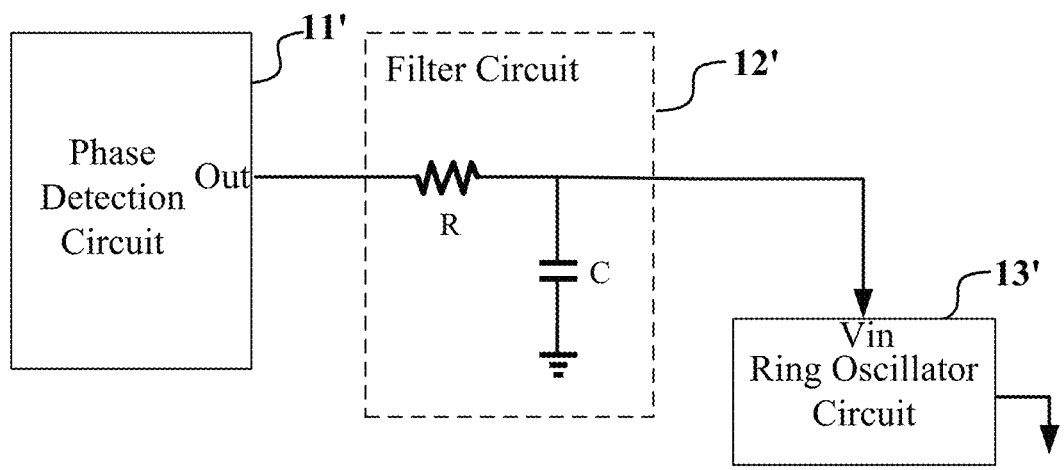
FIG. 5b is a schematic diagram of a filter circuit according to anther embodiment of the present application.

In another embodiment of the present application, referring to FIG. 5b, the filter circuit 12' includes a resistor R and a capacitor C, wherein a terminal of the resistor R is coupled to an output terminal of the phase detection circuit 11', and the other terminal of the resistor R is coupled to a terminal of the capacitor C and the ring oscillator circuit 13', and the other terminal of the capacitor C is grounded.

Figure 6:
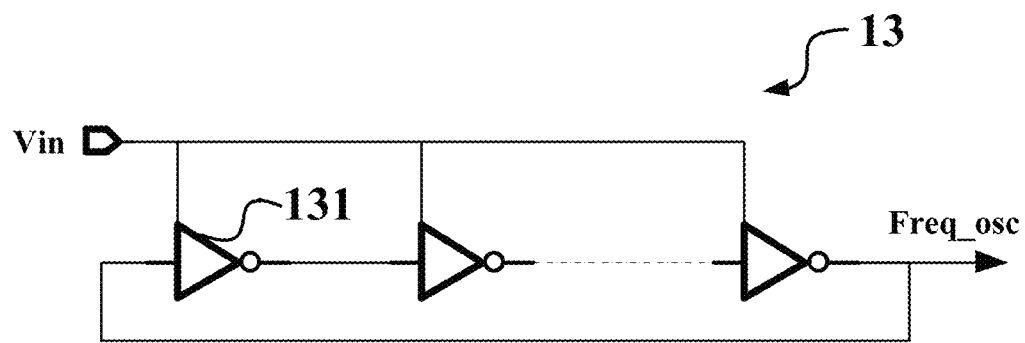
FIG. 6 is a schematic diagram of a ring oscillation circuit according to an embodiment of the present application.
Figure 7:
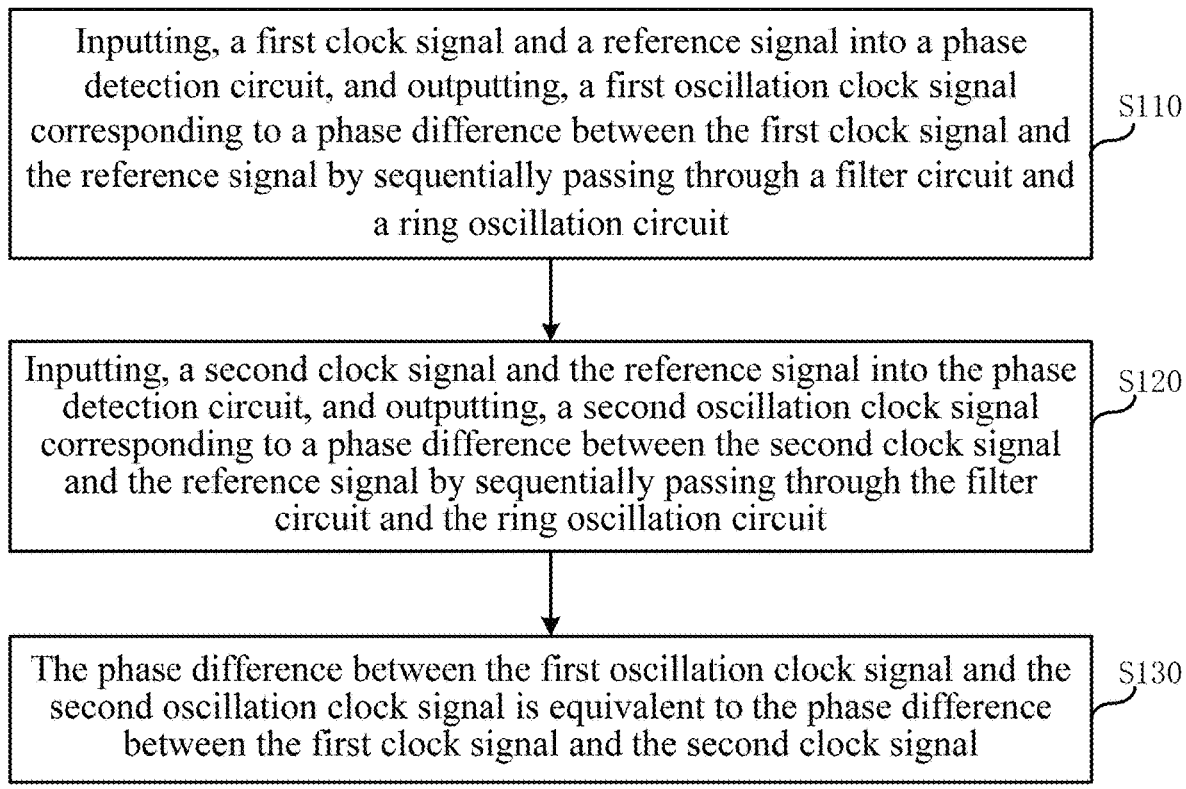
FIG. 7 is a schematic flow chart of phase detection according to an embodiment of the present application.
Figure 8:
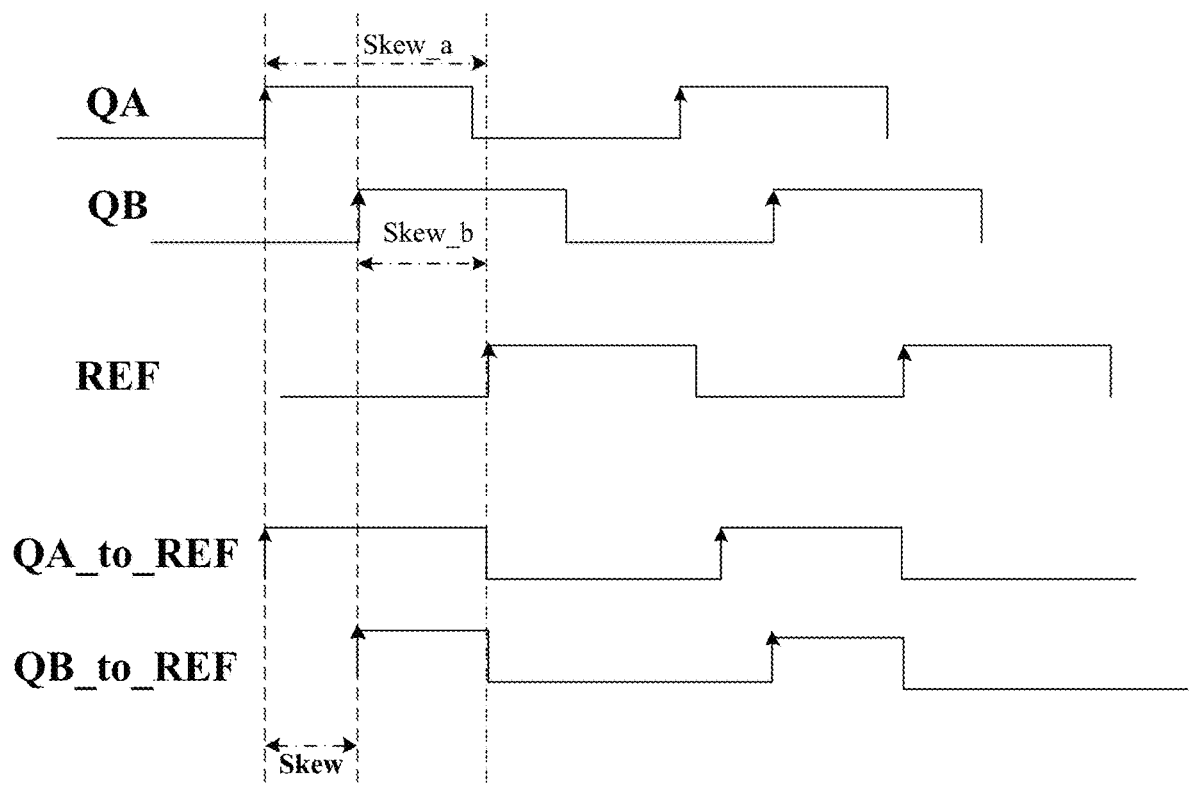
FIG. 8 is a schematic timing diagram of a time-to-digital converter according to an embodiment of the present application.

The input terminal of the ring oscillator circuit 13 is coupled to the output terminal of the filter circuit 12 (or 12') and the ring oscillator circuit 13 outputs an oscillation clock signal corresponding to the pulse width. In a preferred embodiment as shown in FIG. 6, the ring oscillator circuit 13 comprises a plurality of inverters 131 connected in series, and an output signal of the filter circuit 12 (or 12') is output to an input terminal Vin of the respective inverters 131, and the oscillation circuit 13 outputs the oscillation clock signal to the digital control circuit 20.

Figure 3B:
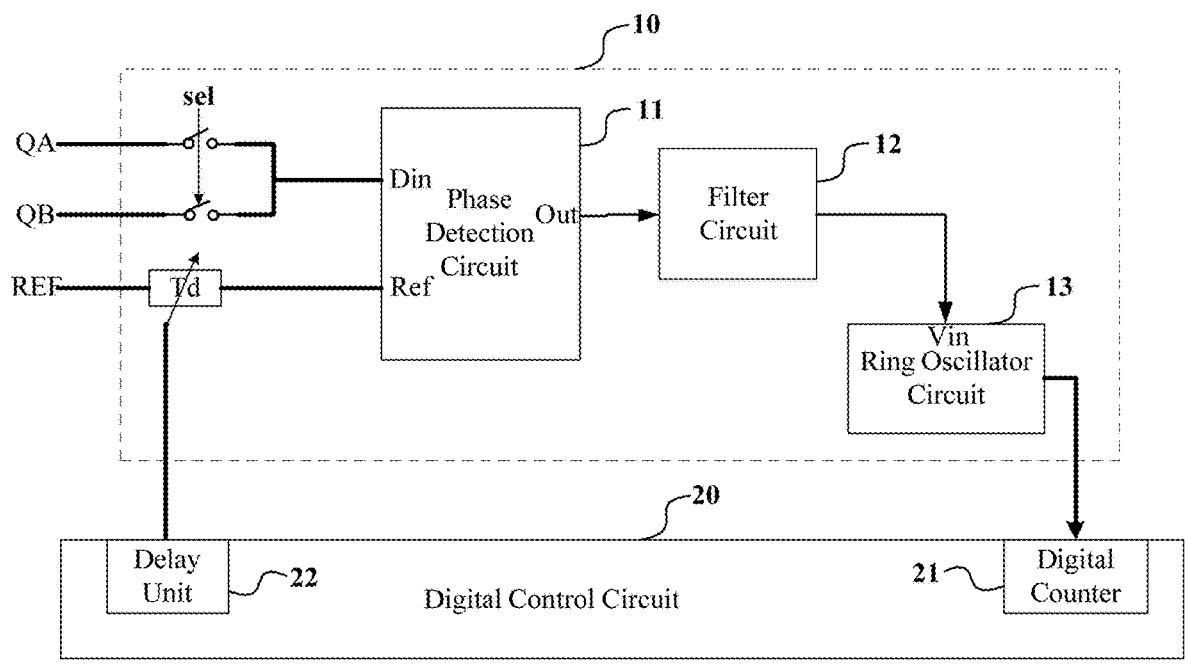
FIG. 3b is a schematic block diagram of a time-to-digital converter according to another embodiment of the present application.

With continued referring to FIG. 3a, the digital control circuit 20 provides a reference signal REF to the phase detection circuit 11 and receives the oscillation clock signal. Delay time Td of the reference signal REF is adjustable, wherein the delay time of the reference signal REF is adjusted by a delay unit 22 of the digital control circuit 20. In another embodiment of the present application, referring to FIG. 3b, the reference signal REF may be provided by an external circuit (not shown), and the delay time is adjusted by the delay unit 22 of the digital control circuit 20.

Referring to FIGS. 3a and 3b, FIG. 7 and FIG. 8, the present application also discloses a phase difference detection method, comprising:

In S110, the switch control signal sel is set at a low level, the switch coupled to the second clock signal QB is turned off and the switch coupled to the first clock signal QA is turned on. The first clock signal QA and the reference signal REF are input to the phase detection circuit 11. A pulse width corresponding to the phase difference Skew_a between the first clock signal QA and the reference signal REF, that is, a pulse width corresponding to the phase difference Skew_a between a rising edge of the first clock signal QA and a rising edge of the reference signal REF, is output by the phase detection circuit 11 and successively passed through the filter circuit 12 and the ring oscillation circuit 13. The filter circuit 12 extracts the DC current portion of the pulse width, and the ring oscillation circuit 13 outputs a first oscillation clock signal QA_to_REF corresponding to the phase difference between the first clock signal QA and the reference signal REF according to the input signal.

In S120, the switch control signal sel is set at a high level, the switch coupled to the first clock signal QA is turned off and the switch coupled to the second clock signal QB is turned on. The second clock detection signal QB and the reference signal REF are input to the phase detection circuit 11. A pulse width corresponding to a phase difference between the second clock signal QB and the reference signal REF, that is, a pulse width corresponding to a phase difference between a rising edge of the second clock signal QB and a rising edge of the reference signal REF, is output by the phase detection circuit 11 and sequentially passed through the filter circuit 12, and the ring oscillator circuit 13. The filter circuit 12 extracts the DC current portion of the pulse width, the ring oscillator circuit 13 outputs a second oscillation clock signal QB_to_REF corresponding to the phase difference between the second clock signal QB and the reference signal REF according to the input signal;

In S130, a digital counter 21 of the digital control current 20 is configured to receive the first oscillation clock signal QA_to_REF and the second oscillation clock signal QB_to_REF respectively. The phase difference between the first oscillation clock signal QA_to_REF and the second oscillation clock signal QB_to_REF is equivalent to the phase difference Skew between the first clock signal QA and the second clock signal QB. In this application, since the time difference between the first clock signal QA and the second clock signal QB is obtained by detecting phase difference between the first clock signal QA and the reference signal REF and detecting phase difference between the second clock signal QB and the reference signal REF, the systematic error caused by the phase detection circuit, the ring oscillator circuit and the like could be effectively eliminated.

It can be understood that, in the present application, S110 and S120 are not limited by their order relationship, the first oscillation clock signal QA_to_REF corresponding to the phase difference between the first clock signal QA and the reference signal REF may be obtained in S110, and the second oscillation clock signal QB_to_REF corresponding to the phase difference between the second clock signal QB and the reference signal REF may be obtained S120; however, in some embodiments, the second oscillation clock signal QB_to_REF corresponding to the phase difference between the second clock signal QB and the reference signal REF may also be obtained in S110, the first oscillation clock signal QA_to_REF corresponding to the phase difference between the first clock signal QA and the reference signal REF may also be obtained in S120, as long as the corresponding clock signals are respectively input, which is within the scope of the protection of the present application.

Figure 9:
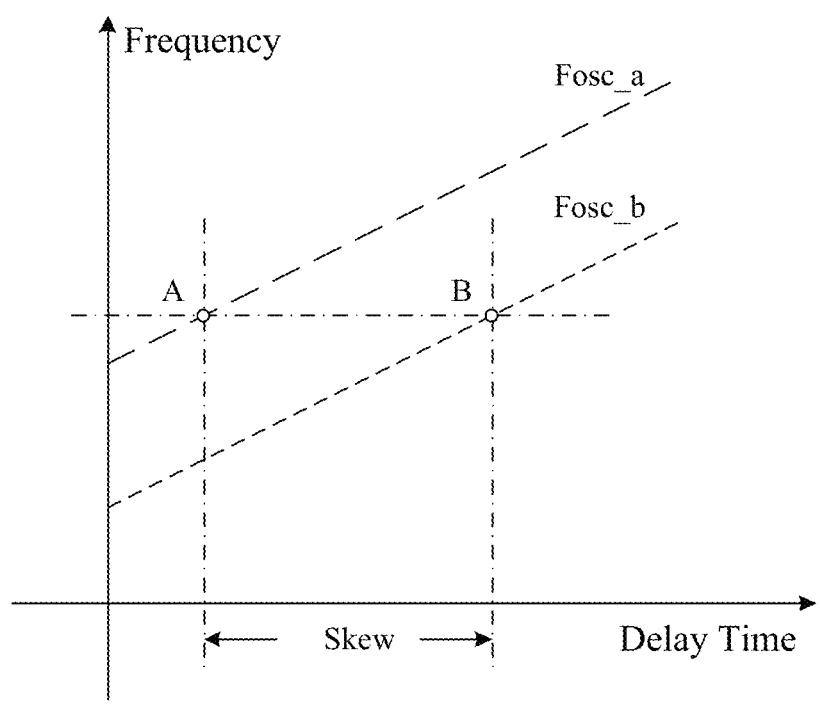
FIG. 9 is a schematic graph that illustrates changes in oscillation frequency with reference signal delay according to an embodiment of the present application.

Further in the present application, a relationship between an output frequency of the ring oscillator circuit 13 and the reference signal REF may be obtained by adjusting delay time of the reference signal REF. The relationships between the output frequencies of the ring oscillator circuit and varied delay time of the reference signals corresponding to the clock signals to be detected could be respectively obtained. The phase difference between the clock signals to be detected is the delay time difference between the corresponding reference signals when frequencies of the first oscillation clock signal and the second oscillation clock signal are equal. As shown in FIG. 9, the first clock signal QA and the reference signal REF are input to the phase detection circuit 11, by sequentially passing through the filter circuit 12 and the ring oscillation circuit 13, a first oscillation clock signal corresponding to a phase difference between the first clock signal and the reference signal is output. A relationship Fosc_a between a frequency of the first oscillation clock signal and the varied delay time of the reference signal REF can be obtained by adjusting the delay time of the reference signal REF. Similarly the second clock signal QB and the reference signal REF are input to the phase detection circuit 11, by sequentially passing through the filter circuit 12 and the ring oscillation circuit 13, a second oscillation clock signal corresponding to a phase difference between the second clock signal and the reference signal is output. A relationship Fosc_b between a frequency of the second oscillation clock signal and the varied delay time of the reference signal REF can be obtained by adjusting the delay time of the reference signal REF. And the phase difference (Skew) between the first clock signal QA and the second clock signal QB is equivalent to the delay time difference between the corresponding reference signals when the frequencies of Forc_a and Forc_b are equal.

In the application, the high-precision phase difference detection between the internal signals of the chip can be realized, and detection accuracy of the phase difference is determined by the delay unit of the reference signal and the accuracy of the digital counter, wherein the smaller the step size of the digital adjustable delay unit and the higher the number of digits of the digital counter, the higher the conversion accuracy of the time difference to time-to-digital converter, which avoids the detection error caused by the sampling metastable interval of the traditional D trigger structure and easily implements high-precision of time difference digital detection. At the same time, digital conversion accuracy of the phase difference is determined by the number of digits of digital counters of the digital control circuit, which can be easily expanded.

Figure 10:
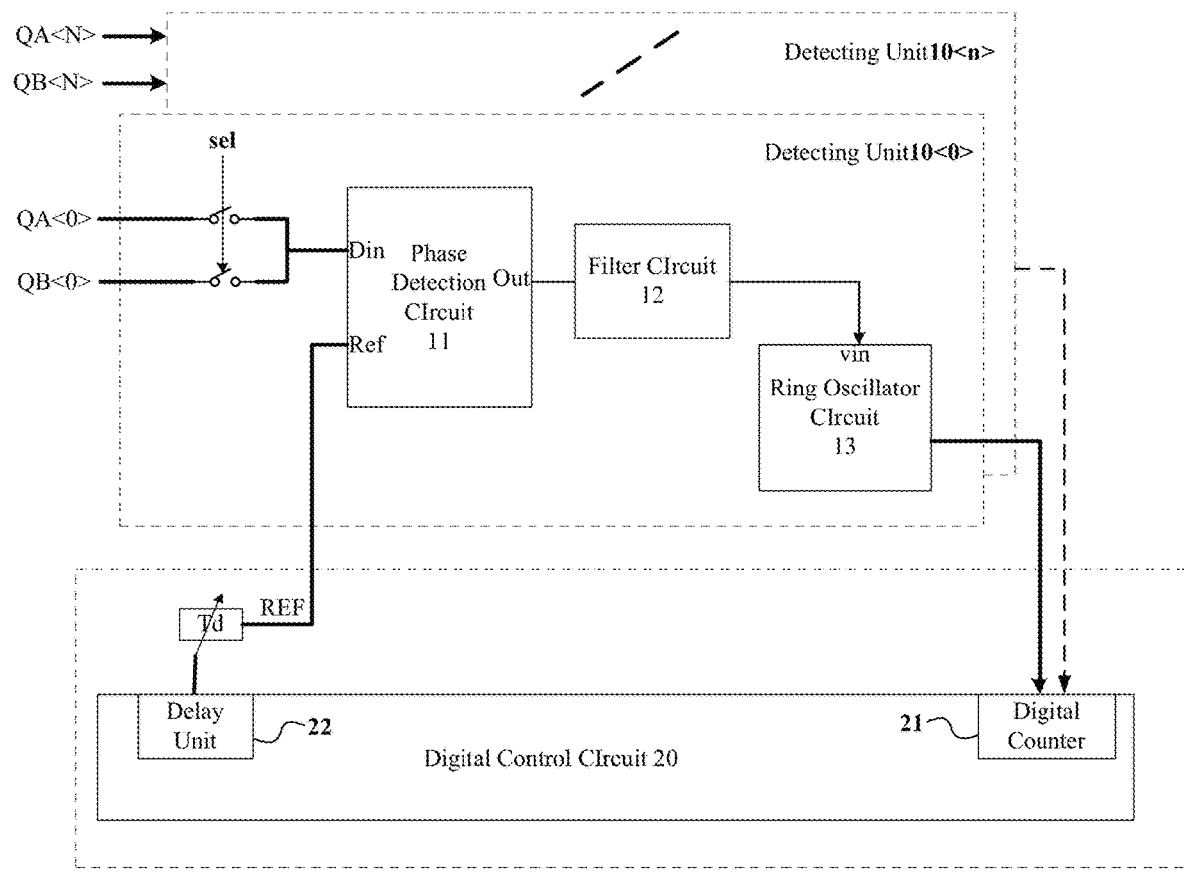
FIG. 10 is a schematic block diagram of a distributed data converter according to an embodiment of the present application.

In a preferred embodiment as shown in FIG. 10, the time-to-digital converter of the present application includes a plurality of detection units 10 and the reference signal coupled to the plurality of detection units 10 is adjusted by a digital control circuit 20. The plurality of detection units 10 may adopt a distributed structure, so that the high-precision digital control circuit 20 may be separated from the plurality of detection units 10. The high-precision digital control circuit 20 is used to provide a common reference signal REF for all detection units 10 and adjust the delay time of the reference signal REF to save chip area and power consumption. In the present application, a plurality of detection units may be connected in a serial or parallel manner, and may be implemented to detect the phase difference of a plurality of clock signals. In addition, the phase detection circuit 10 is close to the signals to be detected to reduce the effects of parasitic and metal wiring loads.

It should be noted that all or any of the embodiments described above may be combined with each other unless otherwise stated or such embodiments may be functionally and/or architecturally mutually exclusive.

While the present application has been described in connection with the specific exemplary embodiments of the invention, the invention is not limited to the embodiments described herein, but may be implemented in a modified or amended form within the spirit and scope of the appending claims. Accordingly, the description and drawings are to be regarded as illustrative and not restrictive.

From the above, it is to be noted that the specific embodiments of the present application are described herein for the purpose of illustration, but may be variously modified without departing from the scope of the application. Accordingly, the application is not limited except by the scope of the appended claims.

Other changes to the disclosed embodiments can be understood and implemented by those skilled in the art via the drawings, the disclosure and the claims. In the claims, the "comprising" or "includes" or "comprises" does not exclude other components or steps, and the indefinite article "a" or "an" does not exclude a plurality. Even though specific features are recited in different dependent claims, the present application is directed to embodiments having these features in common. Any reference signs in the claims should not be construed as limiting.

The features and aspects of the different embodiments may be integrated into other embodiments, and the embodiments shown in this specification can be implemented without all the features or aspects described. It will be appreciated by those skilled in the art that, although the specific examples and embodiments of the present systems and methods are described for illustrative purposes, various modifications may be made without departing from the spirit and scope of the application. Furthermore, the features of one embodiment may be included in another embodiment, even if such features are not described together in this specification in a single embodiment. Accordingly, the application is described by the appending claims

What is claimed is:

1. A time-to-digital converter, comprising a detection unit and a digital control circuit:
   the detection unit comprising:
   a phase detection circuit, wherein a first clock signal and a second clock signal to be detected are respectively coupled to an identical input terminal of the phase detection circuit and a reference signal is coupled to another input terminal of the phase detection circuit; the phase detection circuit is configured to output a pulse width corresponding to a phase difference between the first clock signal or the second clock signal and the reference signal;
   a filter circuit, coupled to an output terminal of the phase detection circuit; and
   a ring oscillator circuit, coupled to an output terminal of the filter circuit and configured to output an oscillation clock signal corresponding to the pulse width;
   the digital control circuit is configured to provide the reference signal and receive the oscillation clock signal.

2. The time-to-digital converter of claim 1, wherein delay time of the reference signal is adjustable.

3. The time-to-digital converter of claim 2, wherein the delay time of the reference signal is adjusted by a delay unit of the digital control circuit.

4. The time-to-digital converter of claim 1, wherein the phase detection circuit comprises a D trigger.

5. The time-to-digital converter of claim 1, wherein the first clock signal and the second clock signal are separately coupled to the identical input terminal of the phase detection circuit via respective switches.

6. The time-to-digital converter of claim 1, wherein the filter circuit comprises an inverter, a PMOS transistor and a capacitor; an input terminal of the inverter is coupled to the output terminal of the phase detection circuit, an output terminal of the inverter is coupled to a gate of the PMOS transistor, a source of the PMOS transistor is coupled to a power supply, a terminal of the capacitor is coupled to a drain of the PMOS transistor, the other terminal of the capacitor is grounded, the drain of the PMOS transistor is coupled to an input terminal of the ring oscillator circuit.

7. The time-to-digital converter of claim 1, wherein the filter circuit comprises a resistor and a capacitor; a terminal of the resistor is coupled to the output terminal of the phase detection circuit, the other terminal of the resistor is coupled to a terminal of the capacitor and the ring oscillator circuit, the other terminal of the capacitor is grounded.

8. The time-to-digital converter of claim 1, wherein the ring oscillator circuit comprises a plurality of inverters connected in series.

9. The time-to-digital converter of claim 1, wherein the time-to-digital converter comprises a plurality of detection units, the digital control circuit adjusts the reference signal coupled to the plurality of detection units.

10. A phase difference detection method, comprising:
    inputting, a first clock signal and a reference signal into a phase detection circuit, and outputting, a first oscillation clock signal corresponding to a phase difference between the first clock signal and the reference signal by sequentially passing through a filter circuit and a ring oscillation circuit; and
    inputting, a second clock signal and the reference signal into the phase detection circuit, and outputting, a second oscillation clock signal corresponding to a phase difference between the second clock signal and the reference signal by sequentially passing through the filter circuit and the ring oscillation circuit;
    wherein the phase difference between the first oscillation clock signal and the second oscillation clock signal is equivalent to the phase difference between the first clock signal and the second clock signal.

11. The phase difference detection method of claim 10, further comprising:
    by adjusting delay time of the reference signal, obtaining, respectively a relationship between a frequency of the first oscillation clock signal and the delay time of the reference signal and a relationship between a frequency of the second oscillation clock signal and the delay time of the reference signal;
    wherein the phase difference between the first clock signal and the second clock signal is equivalent to delay time difference between the corresponding reference signals when the frequencies of the first and second oscillation clock signals are equal.

* * * * *